(12) United States Patent
Heidtmann et al.

(10) Patent No.: US 6,410,905 B1
(45) Date of Patent: Jun. 25, 2002

(54) CCD WITH ENHANCED OUTPUT DYNAMIC RANGE

(75) Inventors: Denis L Heidtmann; Morley M Blouke; Taner Dosluoglu, all of Portland, OR (US)

(73) Assignee: Scientific Imaging Technologies, Inc., Tigard, OR (US)

( * ) Notice: Subject to any disclaimer, the term of this patent is extended or adjusted under 35 U.S.C. 154(b) by 0 days.

(21) Appl. No.: 09/466,420

(22) Filed: Dec. 17, 1999

(51) Int. Cl.[7] .............................................. H01L 31/00
(52) U.S. Cl. .................................................. 250/214.1
(58) Field of Search ........................ 250/214.1; 257/239, 257/240, 241, 289–292

(56) References Cited

U.S. PATENT DOCUMENTS 5,483,091 A * 1/1996 West et al. .................. 257/239
6,184,055 B1 * 2/2001 Yang et al. .................. 257/292

OTHER PUBLICATIONS

Data Sheet for Thomson–CSF TH7899M, Jun. 1998, Full Field CCO Image Sensor 2048X2048 pixels, pp. 1/22, 4/22.
Blouke, Morley M., James R. Janesick, Tom Elliott, Jospeh E. Hall, Marvin W. Cowens and Patrick J. May, "Current Status of the 800x800 Charge–Coupled–Device Image Sensor," Optical Engineering, Sep. 1987, vol. 26 No. 9, 864–874.

\* cited by examiner

*Primary Examiner*—Stephone B. Allen
(74) *Attorney, Agent, or Firm*—Smith-Hill and Bedell; John Smith-Hill

(57) ABSTRACT

A CCD has a floating diffusion for receiving charge packets to be sensed, a reset diffusion connected to a reference potential level and a reset channel region between the floating diffusion and the reset diffusion. A first reset gate is positioned over a first segment of the reset channel region for controlling the conductivity of the first segment in accordance with the potential of the first reset gate, and a second reset gate is positioned over a second segment of the reset channel region between the first reset gate and the reset diffusion for controlling the conductivity of the second segment in accordance with the potential of the second reset gate. Each reset gate has a first state in which the respective segment of the reset channel region is conductive and a second state in which the respective segment of the reset channel region is not conductive, whereby a charge packet entering the floating diffusion sees a relatively small effective capacitance when the first reset gate is in the second state and sees a relatively large effective capacitance when the first reset gate is in the first state and the second reset gate is in the second state. A reset gate controller controls dynamically the states of the first and second reset gates in accordance with predicted size of a charge packet entering the floating diffusion.

13 Claims, 3 Drawing Sheets

US 6,410,905 B1

CCD WITH ENHANCED OUTPUT DYNAMIC RANGE

BACKGROUND OF THE INVENTION

This invention relates to a charge-coupled device (CCD) with enhanced output dynamic range.

FIG. 1 illustrates schematically the readout section 2 of a conventional 3-phase CCD. The readout section 2 includes a serial register 4 implemented by a segment of a channel of N conductivity formed in a die of P-type silicon. The serial register 4 has several stages 6. Three of the stages, designated $6_1$, $6_2$ and $6_3$ respectively, are shown in FIG. 1. A gate structure, illustrated in FIG. 1 as a 3-phase gate structure, overlies the serial register and functionally divides each stage of the serial register into three cells. The three cells of a given stage of the serial register are referred to herein as cells 1, 2 and 3 respectively, in accordance with the phase of the gate structure overlying the cells. The 3-phase gate structure is connected to a clock generator 14 which can be controlled to generate a 3-phase clock signal.

FIG. 1 also shows an N+ floating diffusion 8 and an N+ reset diffusion 10. The floating diffusion 8 is connected to the gate of an on-chip charge sensing amplifier, which may be a MOSFET source follower 16. The source of the MOSFET is connected to a signal chain 24, which includes an A/D converter 28 and provides a digital output signal to a signal processor 32. The reset diffusion 10 is connected to a predetermined reference potential $V_R$. A summing well 12, controlled by a summing gate SG, is between the serial register 4 and the floating diffusion 8. The summing gate SG is located between the last stage of the 3-phase gate structure and a last gate LG. The summing gate SG is driven by a summing gate driver 18 between high and low clocking levels $V_H$ and $V_L$ and the last gate LG is held at a voltage $V_{LG}$ which is slightly more positive than $V_L$. A reset gate RG overlies the region of the channel between the floating diffusion 8 and the reset diffusion.

In operation of the readout section shown in FIG. 1, charge packets are introduced into the different stages 6 of the serial register. The charge packets may be formed in a sensing region of the device and shifted from the sensing region into the serial register. Typically, the clock generator 14 holds phases 1 and 2 of the gate structure high and phase 3 low when the charge packets are shifted into the serial register, so that a charge packet is held in cells 1 and 2 of stage $6_i$ of the shift register while cell 3 provides a barrier between the charge packet in stage $6_i$ and the packet in cells 1 and 2 of stage $6_{i-1}$ of the serial register. During this phase of operation, the summing gate and the reset gate will typically be low. When the charge packets have been shifted into the respective stages of the serial register, the clock generator 14 applies the 3-phase clock signal to the 3-phase gate structure and the charge packets are shifted from left to right in FIG. 1. The summing gate driver 18 clocks the summing gate SG high and the charge packet from the last stage $6_1$ of the serial register is shifted into the summing well 12. The potential of the last gate LG, being lower than the potential of the summing gate SG, provides a barrier retaining the charge packet in the summing well 12. Subsequently, the summing gate SG is driven low and the charge packet moves past the last gate LG into the floating diffusion 8. Prior to shifting the charge packet into the floating diffusion, the reset gate RG is driven high thereby connecting the floating diffusion to the reset diffusion 10. The reset gate is then driven low. In this manner, the floating diffusion is set to the reference potential $V_R$ and is then isolated from the reset diffusion 10.

When the charge packet enters the floating diffusion 8 from the summing well, the voltage of the floating diffusion changes by an amount that depends on the size of the charge packet. The MOSFET 16 generates an output voltage change which depends on the potential change of the floating diffusion and hence on the size of the charge packet in the floating diffusion. The signal chain 24 provides a digital output signal that depends on the output voltage change of the MOSFET 16.

After the charge packet has been sensed by the MOSFET 16, the reset gate RG is driven sequentially high and low, setting the floating diffusion 8 to the reference potential $V_R$ as before.

The size of the charge packets delivered to the floating diffusion in a CCD of the kind shown in FIG. 1 varies over a wide dynamic range. It is desirable that the signal chain be able to measure a small packet with a high degree of precision and that it also be able to measure a large packet.

The dynamic range of the packet size that can be measured depends on the number of bits that can be quantized by the A/D converter 28. If the A/D converter is able to quantize to 10 bits and the voltage of the least significant bit of the digital signal generated by the A/D converter corresponds to the read noise $V_n$, the dynamic range of the packet size that can be measured is $2^{10}$. It would be desirable to have a wider dynamic range in some applications.

The sensitivity of the output amplifier structure composed of the floating diffusion 8 and the MOSFET 16 is typically measured in terms of the change in output voltage per unit of signal charge supplied to the floating diffusion 8. The voltage change sensed by the MOSFET is given by q/C, where q is the size of the charge packet and C is the capacitance seen by the charge packet entering the floating diffusion. Therefore, an important parameter in determining the sensitivity of the output amplifier structure is the capacitance seen by the charge packet entering the floating diffusion. For example, if the voltage gain of the MOSFET is unity and the charge packet sees a capacitance of 0.1 pF, the sensitivity is 1.6 microvolts per electron. Sensitivity values of from 0.5 microvolts per electron to more than 10 microvolts per electron are common.

SUMMARY OF THE INVENTION

Since the sensitivity of the output amplifier structure depends on the capacitance seen by a charge packet entering the floating diffusion, the sensitivity can be selectively reduced, and the dynamic range selectively increased, by increasing the capacitance seen by the charge packet entering the floating diffusion.

In accordance with a first aspect of the invention there is provided a CCD having a floating diffusion for receiving charge packets to be sensed, a reset diffusion connected to a reference potential level, a reset channel region between the floating diffusion and the reset diffusion, a first reset gate positioned over a first segment of the reset channel region for controlling conductivity of said first segment in accordance with potential of the first reset gate, and a second reset gate positioned over a second segment of the reset channel region between the first reset gate and the reset diffusion for controlling conductivity of said second segment in accordance with potential of the second reset gate, each reset gate having a first state in which the respective segment of the reset channel region is conductive and a second state in which the respective segment of the reset channel region is not conductive, whereby a charge packet entering the floating diffusion sees a relatively small effective capacitance when the first reset gate is in the second state and sees a relatively large effective capacitance when the first reset gate is in the first state and the second reset gate is in the second state, and the CCD also having a reset gate controller for dynamically controlling the states of the first and second reset gates in accordance with predicted size of a charge packet entering the floating diffusion.

In accordance with a second aspect of the invention there is provided a CCD having a floating diffusion for receiving charge packets to be sensed, a reset diffusion connected to a reference potential level, a reset channel region between the floating diffusion and the reset diffusion, a reset gate positioned over the reset channel region for controlling conductivity of the reset channel region in accordance with potential of the reset gate, an auxiliary channel region connected at one end to the floating diffusion, an auxiliary gate positioned over the auxiliary channel region for controlling conductivity of the auxiliary channel region in accordance with potential of the auxiliary gate, each gate having a first state in which the respective channel region is conductive and a second state in which the respective channel region is not conductive, whereby a charge packet entering the floating diffusion sees a relatively small effective capacitance when the auxiliary gate and the reset gate are each in the second state and sees a relatively large effective capacitance when the auxiliary gate is in the first state and the reset gate is in the second state, and the CCD also having a reset gate controller for dynamically controlling the states of the reset gate and the auxiliary gate in accordance with predicted size of a charge packet entering the floating diffusion.

In accordance with a third aspect of the invention there is provided a CCD having a floating diffusion for receiving charge packets to be sensed, a read-ahead well through which a charge packet passes in transit to the floating diffusion, and a circuit in operative connection with the read-ahead well to generate a signal dependent on the size of a charge packet in the read-ahead well.

In accordance with a fourth aspect of the invention there is provided a method of operating a CCD having a floating diffusion for receiving charge packets to be sensed and an output amplifier with an input coupled to the floating diffusion for generating an output signal that depends on the size of a charge packet in the floating diffusion with a sensitivity that depends on the capacitance seen by the charge packet when entering the floating diffusion, the method comprising adjusting the capacitance seen by the charge packet depending on the size of the charge packet.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
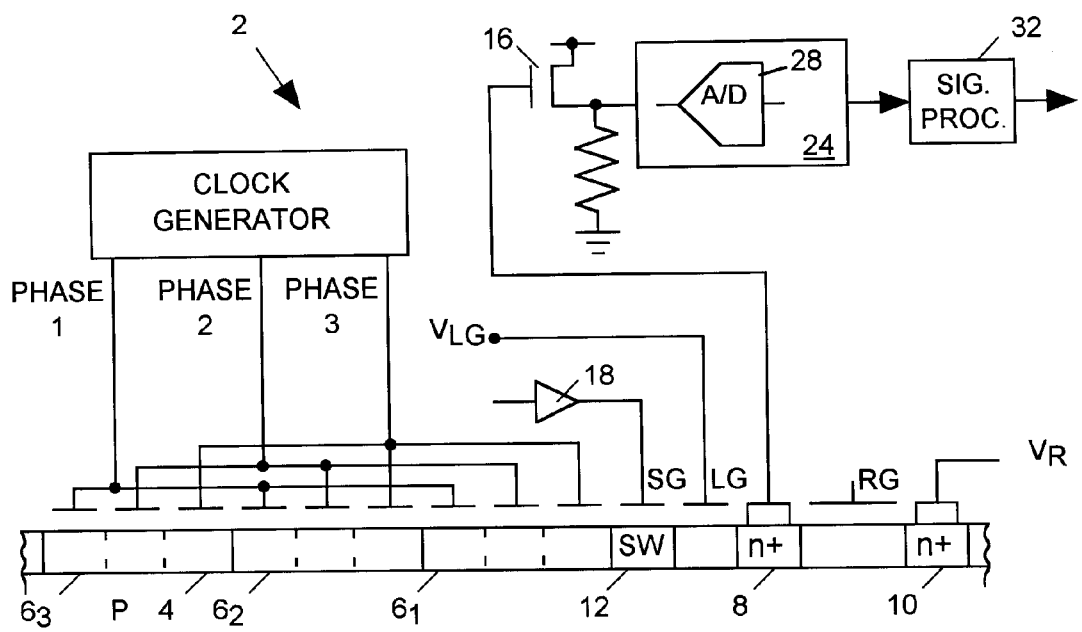
FIG. 1 is a schematic partial sectional view of the readout register of a CCD in accordance with the prior art.
Figure 2:
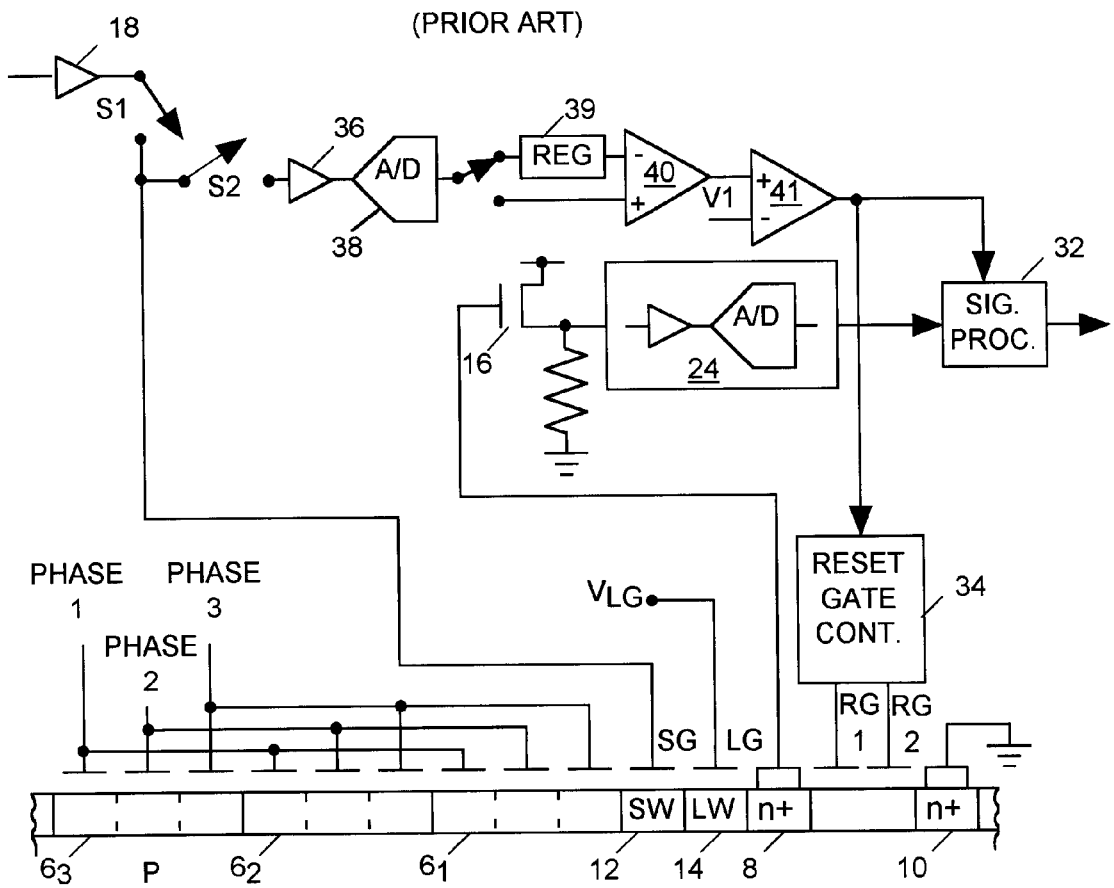
FIG. 2 is a similar view of a first CCD in accordance with the present invention.
Figure 3:
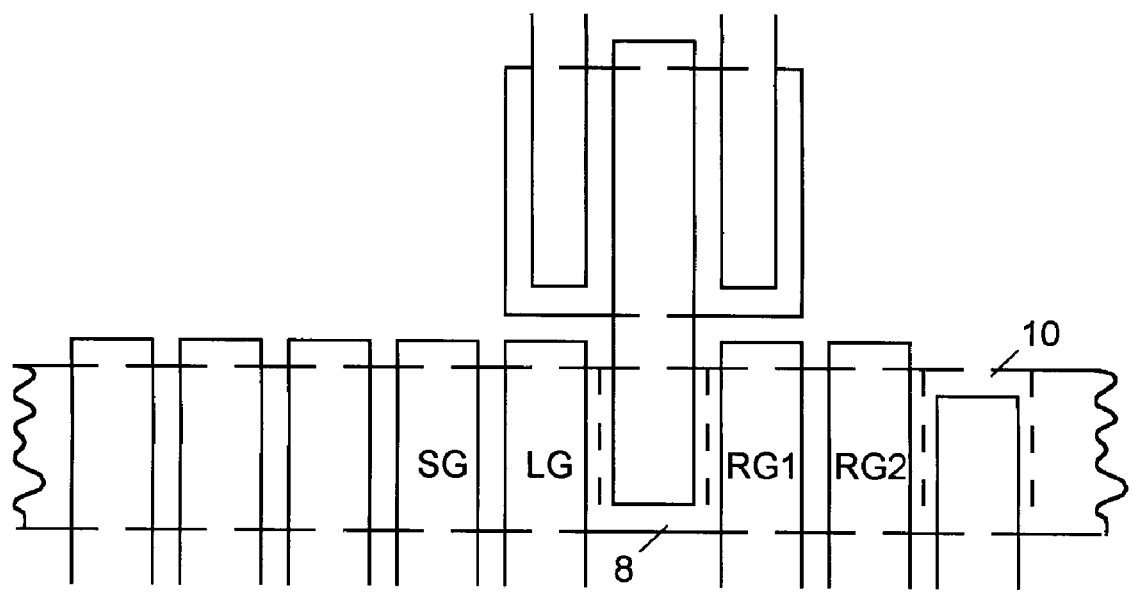
FIG. 3 is a partial top plan view of the CCD shown in FIG. 2.

The CCD shown in FIG. 2 includes two reset gates RG1 and RG2 overlying the region of the channel between the floating diffusion 8 and the reset diffusion 10. The states of the reset gates RG1 and RG2 are controlled by a reset gate controller 34.

The driver 18 for the summing gate SG is connected to the summing gate through a switch S1. The summing gate SG is connected to a floating gate sense amplifier 36, which may be a MOSFET, through a switch S2, which isolates the input of the amplifier 36 from the driver 18 when the switch S1 is closed (conductive) and allows the sense amplifier 36 to sample the potential of the summing gate SG when the switch S1 is open (non-conductive).

Let us assume an initial state in which phases 1 and 3 of the 3-phase clock signal are low and phase 2 is high, the output of the summing gate driver 18 is high, there is a charge packet Q1 in cell 2 of stage $6_1$ of the serial register but there is no charge packet in the summing well, the switch S1 is closed and the switch S2 is open. The switch S1 is then opened, isolating the summing gate from the driver 18. The potential of the summing gate depends on the voltage to which the summing gate capacitance was charged by the summing gate driver 18. The switch S2 is closed and opened, and the sense amplifier 36 samples the potential of the summing gate SG. An A/D converter 38 quantizes the output voltage of the sense amplifier (SAMPLE 1) and the digital value of SAMPLE 1 is stored in a register 39. The 3-phase gate structure of the serial register is clocked through a full rotation so that the charge packet Q1, which was in cell 2 of stage $6_1$ of the serial register, is shifted into the summing well and the serial clocks are returned to their original states, with a new charge packet Q2 in cell 2 of stage $6_1$ of the serial register. When the charge packet Q1 enters the summing well, the potential of the summing gate changes by a amount proportional to the size of the charge packet Q1. The switch S2 is again closed and opened, and the amplifier 36 again samples the potential of the summing gate SG. The A/D converter 38 quantizes the output voltage of the sense amplifier (SAMPLE 2). A differential amplifier 40 subtracts the value of SAMPLE 1 from SAMPLE 2, returning a difference value $\Delta V$ equal to (SAMPLE2–SAMPLE1). The magnitude $\Delta V^+$ of the difference value $\Delta V$ is proportional to the size of the charge packet Q1. The switch S1 is closed, reconnecting the summing well gate to its driver 18 and the driver 18 clocks the summing well gate to shift the charge packet Q1 to the floating diffusion 8. We have now returned to the initial state.

A comparator 41 compares the magnitude $\Delta V^+$ of the difference value $\Delta V$ with a predetermined threshold V1 and provides an output signal having a high level if $\Delta V^+$ exceeds V1 and otherwise having a low level. The output of the comparator 41 is supplied to the reset gate controller 34 and to the signal processor 32.

The reset gate controller controls the state of the first reset gate RG1 in accordance with the size of the charge packet as sensed by the amplifier 36 and comparator 41. If the charge packet is small, the reset gate RG1 is low and the portion of reset channel beneath the reset gate RG1 has no effect on the capacitance seen by the charge packet entering the floating diffusion 8. If the charge packet is large, the reset gate RG1 is high and the reset gate RG2 is low, and the capacitance seen by the charge packet entering the floating diffusion includes a contribution due to the capacitance of the portion of the reset channel beneath the reset gate RG1 and may be substantially greater than if the reset gate RG1 had been low. It will therefore be seen that the output amplifier structure (including the floating diffusion 8 and the source follower 16) has a high sensitivity mode, in which the reset gate RG1 is low, and a low sensitivity mode, in which the reset gate RG1 is high.

After the charge packet has been sensed by the MOSFET 16, the reset gate RG2 is driven high (and so is the reset gate RG1 if the gate RG1 previously was low) and the floating diffusion is thereby connected to the reset diffusion 10 and the floating diffusion is returned to the reference potential.

If the number of bits available from the A/D converter is ADbits and the voltage $V_{L1}$ of the least significant bit in the high sensitivity mode is at the level of the read noise of the signal sensed by the MOSFET 16, the voltage $V_{M1}$ of the most significant bit in the high sensitivity mode is equal to $V_{L1}*2^{ADbits}$. If it is desired that the voltage $V_{M2}$ of the most significant bit in the low sensitivity mode be equal to $V_{L1}*2^{Tbits}$, Tbits is the number of bits required from the system and the voltage $V_{L2}$ the least significant bit in the low sensitivity mode is equal to $V_{M2}/2^{ADbits}$. If E is the number of bits taken up by the maximum error in the floating gate amplifier 36, reflecting the voltage range in which a charge packet could be incorrectly characterized as small or large, adequate overlap is provided between the two sensitivity modes if $V_{M1}/V_{L2}=2^E$. This implies that ADbits=(E+Tbits)/2. Thus, for ADbits=10 and E=1, Tbits=19.

The output signal of the comparator 41 is provided to the signal processor 32 so that the digital value representing each packet will be properly processed, taking account of whether the packet size was measured in the high sensitivity mode or the low sensitivity mode. The size of the charge packet, as represented by the output signal of the comparator 41, can also be used to control operation of the signal processor 32 by allowing higher speed readout when the packets are large and lower speed when the packets are small and a lower noise floor is desired.

By sampling the potential of the summing gate both when the summing well is empty and when the summing well contains a charge packet, it is possible to compensate for offsets associated with applying voltage to the summing gate. Because the clocks are at the same state for both samples, the difference ΔV between SAMPLE 1 and SAMPLE 2 has minimum interference from influence of clock edges.

Figure 4:
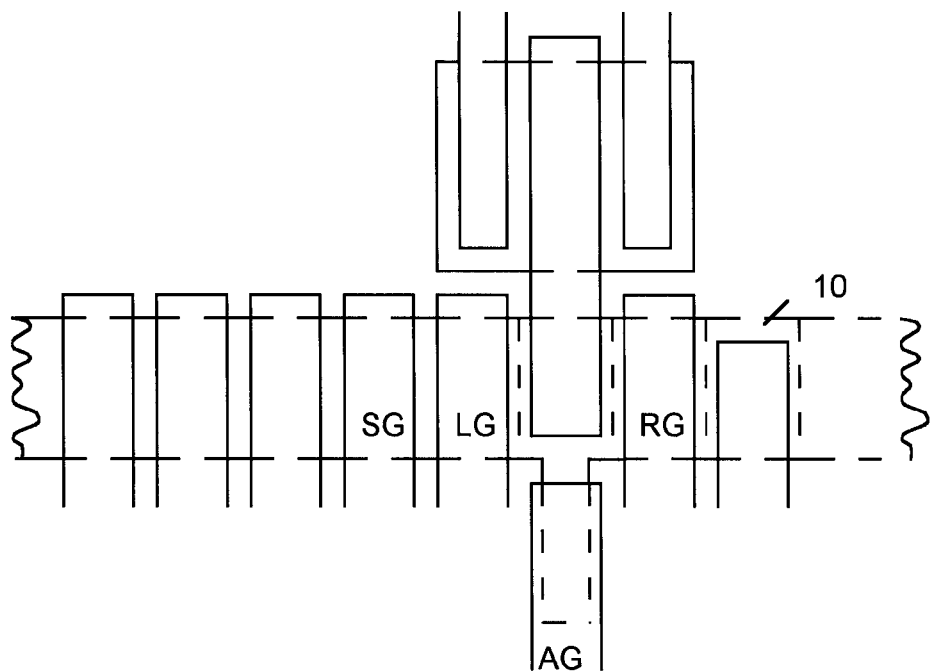
FIG. 4 is a partial top plan view of a second CCD in accordance with the present invention.

Referring to FIG. 4, it is not essential that the additional capacitance seen by the charge packet entering the floating diffusion be provided by the reset channel region between the floating diffusion and the reset diffusion. FIG. 4 illustrates the possibility of a single reset gate RG for controlling the connection between the floating diffusion and the reset diffusion and an auxiliary gate AG for controlling the state of an auxiliary channel region extending from the floating diffusion 8. When the auxiliary gate is low, the auxiliary channel region has no effect on the capacitance seen by the charge packet entering the floating diffusion 8, whereas when the auxiliary gate is high, the capacitance seen by the charge packet entering the floating diffusion is increased. The amount by which the effective capacitance of the floating diffusion is increased by driving the auxiliary gate AG high depends on the channel area influenced by the auxiliary gate and other physical characteristics of the channel.

Figure 5:
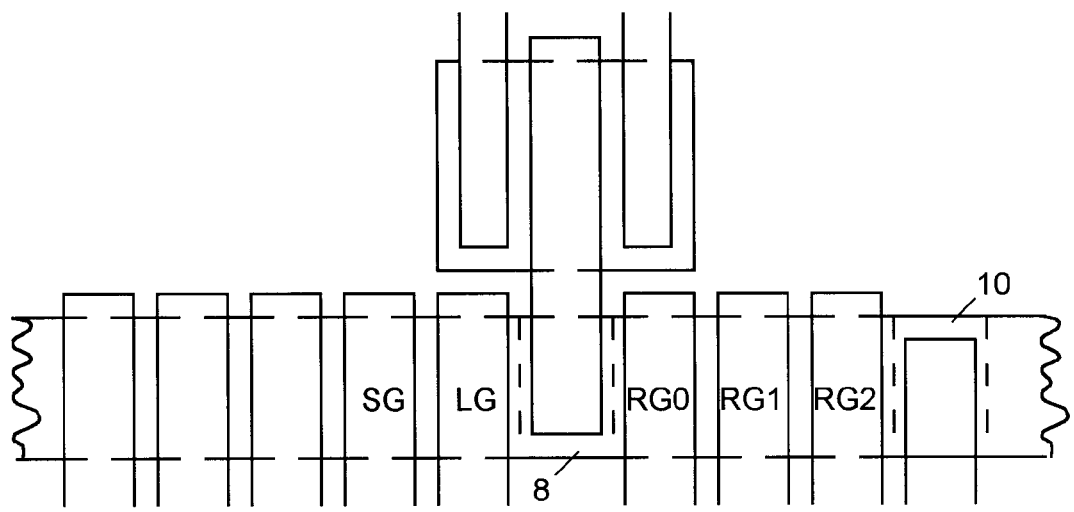
FIG. 5 is a partial top plan view of a third CCD in accordance with the present invention.

Referring to FIG. 5, an additional reset gate RG0 provides at least one additional sensitivity mode. In order to use the additional sensitivity mode to advantage, it is necessary to measure the output of the floating gate amplifier 36 with respect to two break points instead of just one as in the case of FIG. 2. For maximum sensitivity, RG0 is low when the charge packet enters the floating diffusion. For minimum sensitivity, both RG0 and RG1 are high when the charge packet enters the floating diffusion, and for intermediate sensitivity, RG0 is high and RG1 is low.

As noted above, in the case of FIG. 2 the potential of the summing gate is sampled twice for each charge packet in order to compensate for offsets associated with applying voltage to the summing gate. In some applications, it may be appropriate to assume that the offset is negligibly small and in others it may be appropriate to assume that the offset is constant and can be compensated for by adjusting the value of V1. In either case, it is sufficient to sample the potential of the summing gate only once per charge packet. Furthermore, in some applications, such as spectroscopy, it may be possible to predict which charge packets will be small, requiring high sensitivity, and which will be large, requiring low sensitivity, and to control the reset gate controller and signal processor on the basis of this information, without measuring charge packet size.

It will be appreciated that the invention is not restricted to the particular embodiments that have been described, and that variations may be made therein without departing from the scope of the invention as defined in the appended claims and equivalents thereof. For example, the invention is not restricted to sensing the size of the charge packet using a floating gate sense amplifier, and another device that can sense the size of the charge packet non-destructively, i.e. without influencing the size of the charge packet, may be used instead. Further, it is not necessary to sense the size of the charge packet in the summing well or in the floating diffusion and it would be possible to sense the size of the charge packet before it reaches the summing well, for example by employing a charge sensing device in the serial register. In this case it would be necessary to store the value of the output of the comparator 41 until the charge packet reaches the floating diffusion 8.

What is claimed is:

1. A CCD having a floating diffusion for receiving charge packets to be sensed, a reset diffusion connected to a reference potential level, a reset channel region between the floating diffusion and the reset diffusion, a first reset gate positioned over a first segment of the reset channel region for controlling conductivity of said first segment in accordance with potential of the first reset gate, and a second reset gate positioned over a second segment of the reset channel region between the first reset gate and the reset diffusion for controlling conductivity of said second segment in accordance with potential of the second reset gate, each reset gate having a first state in which the respective segment of the reset channel region is conductive and a second state in which the respective segment of the reset channel region is not conductive, whereby a charge packet entering the floating diffusion sees a relatively small effective capacitance when the first reset gate is in the second state and sees a relatively large effective capacitance when the first reset gate is in the first state and the second reset gate is in the second state, and the CCD also having a reset gate controller for dynamically controlling the states of the first and second reset gates in accordance with predicted size of a charge packet entering the floating diffusion.

2. A CCD according to claim 1, including a read-ahead well through which a charge packet passes in transit to the floating diffusion, and wherein the reset gate controller is in operative connection with the read-ahead well to control the state of the first reset gate when the charge packet enters the floating diffusion in accordance with the size of the charge packet.

3. A CCD according to claim 2, including a charge sensing device for generating a voltage dependent on the size of the charge packet in the read-ahead well and a comparator for comparing the output voltage of the charge sensing device with at least one threshold value and generating an output signal having a first state if the output voltage of the charge sensing device exceeds said one threshold value and otherwise having a state other than said first state, and wherein the reset gate controller is responsive to the output signal of the comparator.

4. A CCD according to claim 3, wherein the comparator compares the output voltage of the charge sensing device with a single threshold value and generates said output signal having said first state if the output voltage of the charge sensing device exceeds said one threshold value and otherwise having a second state.

5. A CCD according to claim 3, wherein the comparator compares the output voltage of the charge sensing device with first and second threshold values, the first value being greater than the second value, and generates said output signal having said first state if the output voltage of the charge sensing device exceeds said first threshold value, having a second state if the output voltage of the charge sensing device is less than said second threshold value, and having a third state if the output voltage of the charge sensing device is intermediate said first and second threshold values.

6. A CCD according to claim 3, wherein the charge sensing device is a floating gate amplifier.

7. A CCD according to claim 2, comprising an amplifier having a first stage for buffering the floating diffusion and a second stage for generating a signal having a voltage proportional to the size of the charge packet in the floating diffusion, and an A/D converter for converting the signal generated by the second stage of the amplifier to digital form.

8. A CCD according to claim 2, having a serial register for supplying charge packets to the floating diffusion and a last gate between the serial register and the floating diffusion and wherein the read-ahead well is upstream of the last gate with respect to direction of transfer of charge packets.

9. A CCD according to claim 8, wherein the read-ahead well is between the serial register and the last gate.

10. A CCD having a floating diffusion for receiving charge packets to be sensed, a reset diffusion connected to a reference potential level, a reset channel region between the floating diffusion and the reset diffusion, a reset gate positioned over the reset channel region for controlling conductivity of the reset channel region in accordance with potential of the reset gate, an auxiliary channel region connected at one end to the floating diffusion, an auxiliary gate positioned over the auxiliary channel region for controlling conductivity of the auxiliary channel region in accordance with potential of the auxiliary gate, each gate having a first state in which the respective channel region is conductive and a second state in which the respective channel region is not conductive, whereby a charge packet entering the floating diffusion sees a relatively small effective capacitance when the auxiliary gate and the reset gate are each in the second state and sees a relatively large effective capacitance when the auxiliary gate is in the first state and the reset gate is in the second state, and the CCD also having a reset gate controller for dynamically controlling the states of the reset gate and the auxiliary gate in accordance with predicted size of a charge packet entering the floating diffusion.

11. A CCD having a floating diffusion for receiving charge packets to be sensed, a read-ahead well through which a charge packet passes in transit to the floating diffusion, and a circuit in operative connection with the read-ahead well to generate a signal dependent on the size of a charge packet in the read-ahead well.

12. A method of operating a CCD having a floating diffusion for receiving charge packets to be sensed and an output amplifier with an input coupled to the floating diffusion for generating an output signal that depends on the size of a charge packet in the floating diffusion with a sensitivity that depends on the capacitance seen by the charge packet when entering the floating diffusion, the method comprising adjusting the capacitance seen by the charge packet depending on the size of the charge packet.

13. A method according to claim 12, comprising sensing the size of a charge packet before it enters the floating diffusion and adjusting the capacitance seen by the charge packet depending on the sensed size of the charge packet.

* * * * *